United States Patent
Ashworth et al.

(10) Patent No.: US 8,583,033 B2
(45) Date of Patent: Nov. 12, 2013

(54) OSCILLATION PROTECTED AMPLIFIER WITH BASE STATION OVERLOAD AND NOISE FLOOR PROTECTION

(75) Inventors: Christopher K. Ashworth, St. George, UT (US); Richard M. Kline, Cedar City, UT (US); Patrick L. Cook, St. George, UT (US); Vernon A. Van Buren, Cedar City, UT (US)

(73) Assignee: Wilson Electronics, LLC, St. George, UT (US)

( * ) Notice: Subject to any disclaimer, the term of this patent is extended or adjusted under 35 U.S.C. 154(b) by 0 days.

(21) Appl. No.: 13/040,125

(22) Filed: Mar. 3, 2011

(65) Prior Publication Data

US 2011/0217943 A1 Sep. 8, 2011

Related U.S. Application Data

(60) Provisional application No. 61/310,988, filed on Mar. 5, 2010, provisional application No. 61/377,763, filed on Aug. 27, 2010.

(51) Int. Cl.
*H04B 3/36* (2006.01)

(52) U.S. Cl.
USPC .............................................. 455/7; 455/15

(58) Field of Classification Search
USPC ......... 455/7, 450, 250.1, 234.1, 232.1, 245.1, 455/69, 13.4, 10, 15, 13.1; 370/318, 400, 370/232; 375/345, 211
See application file for complete search history.

(56) References Cited

U.S. PATENT DOCUMENTS

| | | | |
|---|---|---|---|
| 4,539,527 A | 9/1985 | Ishigaki et al. | |
| 4,595,803 A | 6/1986 | Wright | |
| 4,731,869 A | 3/1988 | Farrer | |
| 5,095,528 A | 3/1992 | Leslie et al. | |
| 5,787,336 A | 7/1998 | Hirschfield et al. | |
| 5,815,795 A | 9/1998 | Iwai | |
| 6,384,681 B1 * | 5/2002 | Bonds | 330/149 |
| 6,584,081 B1 * | 6/2003 | Lee et al. | 370/315 |
| 6,892,080 B2 | 5/2005 | Friesen et al. | |
| 7,184,703 B1 * | 2/2007 | Naden et al. | 455/10 |
| 7,233,771 B2 | 6/2007 | Proctor, Jr. et al. | |
| 7,245,880 B1 * | 7/2007 | Jacobsen | 455/69 |
| 7,409,186 B2 | 8/2008 | Van Buren et al. | |
| 7,620,380 B2 * | 11/2009 | Hendrix et al. | 455/232.1 |
| 2002/0101936 A1 | 8/2002 | Wright et al. | |
| 2003/0123401 A1 * | 7/2003 | Dean | 370/318 |
| 2003/0124997 A1 * | 7/2003 | Park | 455/136 |
| 2003/0211828 A1 * | 11/2003 | Dalgleish et al. | 455/11.1 |

(Continued)

OTHER PUBLICATIONS

U.S. Appl. No. 13/439,148, filed Apr. 4, 2012, Van Buren et al.

(Continued)

*Primary Examiner* — Edward Urban
*Assistant Examiner* — Golam Sorowar
(74) *Attorney, Agent, or Firm* — Maschoff Brennan

(57) ABSTRACT

An amplifier is provided for optimizing gain. The amplifier determines an optimal gain from inputs including the forward link and reverse link input power. The inputs are processed to determine an optimal gain of the amplifier. The optimal gain may be accessed from a lookup table that accounts for characteristics of the amplifier, the cell phone (or other device), and the base station (or base stations). The optimal gain is set to account at least for industry standards, amplifier oscillation issues, base station overload protection, and base station noise floor protection.

23 Claims, 7 Drawing Sheets

(56) References Cited

U.S. PATENT DOCUMENTS

| | | |
|---|---|---|
| 2004/0146013 A1 | 7/2004 | Song et al. |
| 2004/0166802 A1* | 8/2004 | McKay et al. ............... 455/15 |
| 2004/0229586 A1 | 11/2004 | Oshima et al. |
| 2005/0272367 A1* | 12/2005 | Rodgers et al. ............. 455/11.1 |
| 2006/0091950 A1 | 5/2006 | Hayase |
| 2006/0209997 A1* | 9/2006 | Van Buren et al. ........... 375/345 |
| 2007/0071128 A1 | 3/2007 | Meir et al. |
| 2007/0197207 A1* | 8/2007 | Carstens et al. ............. 455/423 |
| 2007/0268827 A1* | 11/2007 | Csaszar et al. ............... 370/232 |
| 2008/0014862 A1* | 1/2008 | Van Buren et al. ............... 455/7 |
| 2008/0076437 A1* | 3/2008 | Wilson et al. ................ 455/450 |
| 2008/0212500 A1* | 9/2008 | Zhen et al. .................... 370/277 |
| 2008/0293370 A1* | 11/2008 | Wood ........................ 455/250.1 |
| 2008/0304434 A1 | 12/2008 | Giaretta et al. |
| 2009/0311985 A1* | 12/2009 | Youssoufian et al. ...... 455/226.2 |
| 2010/0009646 A1* | 1/2010 | Mevel et al. ............... 455/234.1 |
| 2010/0093388 A1* | 4/2010 | Bagchi ........................ 455/522 |
| 2010/0159856 A1 | 6/2010 | Kato et al. |
| 2010/0248751 A1 | 9/2010 | Tsutsui |
| 2010/0321219 A1 | 12/2010 | Li |
| 2011/0105060 A1 | 5/2011 | Kim et al. |
| 2011/0190028 A1 | 8/2011 | Hahn et al. |

OTHER PUBLICATIONS

U.S. Appl. No. 13/592,079, filed Aug. 22, 2012, Van Buren et al.
U.S. Appl. No. 13/593,246, filed Aug. 23, 2012, Van Buren et al.
U.S. Appl. No. 11/457,406, filed Feb. 21, 2008, Office Action.
U.S. Appl. No. 11/457,406, filed May 23, 2008, Notice of Allowance.
International Search Report & Written Opinion dated Nov. 6, 2012 as received in application No. PCT/US2012/052144.
International Search Report & Written Opinion dated Nov. 2, 2012 as received in application No. PCT/US2012/052155.

* cited by examiner

OSCILLATION PROTECTED AMPLIFIER WITH BASE STATION OVERLOAD AND NOISE FLOOR PROTECTION

CROSS REFERENCE TO RELATED APPLICATIONS

This application claims the benefit of U.S. Provisional Applications Nos. 61/310,988 filed on Mar. 5, 2010 and 61/377,763 filed on Aug. 27, 2010, which applications are incorporated by reference in their entirety.

BACKGROUND

Booster amplifiers are bi-directional amplifiers used for increasing the sensitivity and power output of cell phones and other devices that are communicating through them. The use of a booster amplifier, however, may disrupt cellular systems of both the network through which the device is communicating and other cellular networks that the device is not communicating through.

The adverse effects of a booster amplifier can result in a power overload situation, where excessive power overshadows other devices and causes them to be dropped or disconnected. A booster amplifier can also increase the noise floor, which decreases the sensitivity of a base station. Increasing the noise floor often decreases the coverage area of a base station and impairs cellular service.

In addition to the disruption of cellular systems, an improperly functioning booster amplifier can cause a subscriber's signal, as received by base stations, to be weaker than necessary. This can result in poor reception of the subscriber's signal by base stations. Under certain conditions, this could even inhibit a subscriber from placing or receiving calls.

Conventional attempts to solve these problems rely on changing the gain of the booster amplifier. However, these attempts often fail to sufficiently protect the cellular network from all of the negative effects that booster amplifiers may cause. These attempts may overly protect the cellular network, for example, by reducing the amplification of the booster amplifier more than necessary. This results in less than optimum performance of the booster amplifier so that a subscriber using the booster amplifier is not able to achieve the maximum benefit that would be obtained from an optimally performing booster amplifier, i.e. one that enables maximum gain/power while remaining compatible with cellular systems.

BRIEF DESCRIPTION OF THE DRAWINGS

To further clarify at least some of the advantages and features of the present invention, a more particular description of the invention will be rendered by reference to specific embodiments thereof which are illustrated in the appended drawings. It is appreciated that these drawings depict only illustrated embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Figure 1:
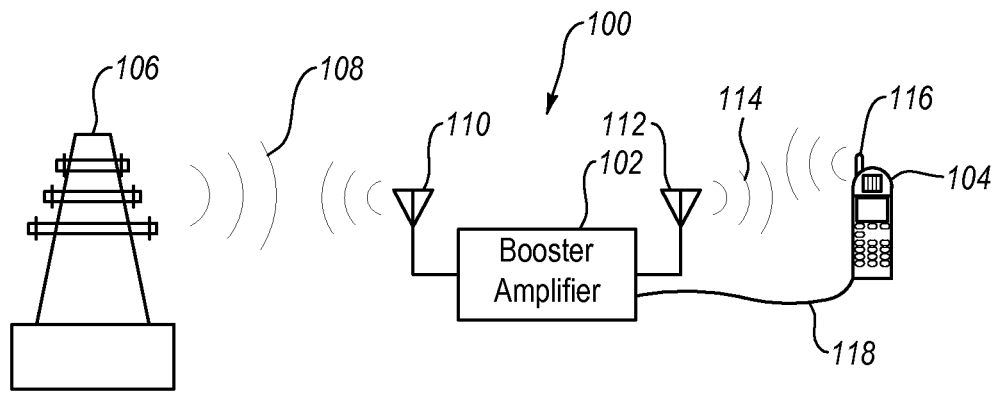
FIG. 1 illustrates an example of an amplifier operating in a communication system.

A properly functioning booster amplifier (also referred to herein as an amplifier) should be transparent to the cellular system such that base stations do not perceive any significant differences for either the case of a cell phone communicating by itself, or a cell phone communicating through the booster amplifier. Additionally, any emissions from the booster amplifier should always be within limits acceptable to cellular systems, even without a cell phone communicating through the amplifier.

Embodiments of the invention may be discussed with reference to a cell phone operating in a cellular network. For purposes of the present invention, the following definitions are provided. The terms "cellular" and "cellular network" refer to a wireless telephone network that connects radio transmissions between a mobile phone and a system of multiple cell sites, each including an antenna and a base station, to a mobile telephone switching office, and ultimately to the public wire line telephone system. Cellular calls are transferred from base station to base station as a user travels from cell to cell. One of skill in the art can appreciate that embodiments of the invention can be applied to other wireless networks including those operating on various frequencies throughout the electromagnetic spectrum.

One of skill in the art, with the benefit of the present disclosure, can appreciate that embodiments of the invention can be used with or included in other devices operating in a wireless network. Exemplary devices include, by way of example only, cell phones, personal digital assistants, smart phones, laptop computers, modems, or other network enabled devices. Wireless networks include cellular networks as well as other wireless networks.

"Cell site" and "base station" are used herein interchangeably. Cell site and base station are defined as the location where the wireless network antenna and communications equipment is placed. The wireless network typically has many base stations in operation. A cell site or base station typically includes a transmitter/receiver, antenna tower, transmission radios and radio controllers for maintaining communications with mobile handsets or other wireless devices within a given range. A cell phone or cellular device may represent one or more such devices. Similarly, base station or cell site can refer to one or more base stations. Cell phone may also represent other devices that communicate through the amplifier. Embodiments of the amplifier, for example, may amplify signals for one or more cell phones in communication with one or more base stations.

The term "reverse link" refers to the transmission path of a signal being transmitted from a handset to a base station. The term "forward link" refers to the transmission path of a signal being transmitted from the base station to the handset. The phrases "reverse link signal" and "forward link signal" are not limited to any particular type of data that may be transmitted between a handset and a base station, but instead are simply used to specify the direction in which a signal is being transmitted.

Embodiments of the invention relate to amplifiers, including booster amplifiers, that enhance the ability of a device such as a cellular telephone (or other device configured to communicate over a wireless network) to communicate in a wireless network. Embodiments extend to a booster amplifier that adjusts the gain, dynamically in some embodiments, that is applied to a wireless signal such as a cellular signal.

One embodiment of a booster amplifier variably adjusts its gain as needed. The ability to automatically adjust the gain applied to a cellular signal can prevent the amplifier from generating emissions that may interfere with the operation of a cellular network within which the amplifier is operating, with other cellular or wireless networks, or with the operation of the amplifier itself. Too much gain, for example, can cause the booster amplifier to oscillate, which results in interference to the cellular network and adversely impacts users of the cellular network. Also, too much gain unnecessarily increases the amount of residual noise at the base stations. Too little gain may interfere with the ability of the cellular telephone to communicate in the wireless network. As previously stated, disruption of the wireless system can include power overload and/or excessive noise floor increase. Embodiments of the invention protect against at least power over load, oscillation, and/or excessive noise floor increase.

Embodiments of the invention consider parameters that may have an impact on the operation of the amplifier when setting the amplifier's gain. The amplifier includes circuitry, modules and/or components (e.g., hardware, software, firmware, etc.) that determine an optimum gain under various circumstances based on these parameters. The amplifier can be configured to determine an optimum gain by mitigating the effect of specific issues individually and/or multiple issues at the same time. The amplifier can determine an optimum gain to mitigate each of the issues that have been considered by the amplifier. In one example the amplifier generates potential gains for each issue. These potential gains can then be harmonized to generate a final gain that may be optimum in light of all the issues that are being mitigated.

Embodiments of the amplifier can be integrated with cellular telephones (or other devices) or connect with a cellular telephone either wirelessly or wired. The amplifier acts as an intermediary between a base station (or other cell site) and a handset (a cellular telephone or other device). Signals generated by the cellular telephone are amplified and retransmitted by the amplifier. The amplifier also receives signals from the base station and transmits them to the cellular telephone after applying a gain to the received signals.

The booster amplifier receives a first cellular signal from a base station via a first antenna and a second cellular signal from a handset via a second antenna. A control circuit analyzes the inputs and/or outputs of the amplifier and adjusts a gain (or an amplification factor) in a manner that accounts for the parameters sensed using various inputs to the amplifier.

The adjusted gain is applied to the first and/or second cellular signals, and the resulting cellular signals are retransmitted via the first and second antennas to the base station and the handset, respectively. In some embodiments, the gain applied to the cellular signals in one direction (e.g., from the base station to the wireless device) may be different from the gain applied to the cellular signals in the other direction (e.g., from the wireless device to the base station).

FIG. 1 shows an exemplary communications system 100. The communications system 100 may be a cellular telephone wireless network or other wireless network. In this example, a booster amplifier 102 (also referred to as an amplifier) amplifies the signals transmitted between a base station 106 and a handset 104. In a typical system, the booster amplifier 102 is located in close proximity to the handset 104 in comparison to the distance to the base station 106. The base station 106 transmits a signal 108 into the surrounding air, which is attenuated for various reasons known to one of skill in the art as it travels outward from the base station 106. An antenna 110 receives the signal 108 and converts the radiated signal into a conducted electrical signal.

The booster amplifier 102 amplifies the electrical signal and communicates the amplified signal to the handset 104. In one example, the booster amplifier 102 may retransmit the electrical signal from a second antenna 112 as an amplified RF signal 114. The amplified signal 114 is received by an antenna 116 of handset 104, which processes the signal and ultimately communicates the appropriate content to a user of handset 104.

As previously indicated, the booster amplifier 102 may be an integral part of, or separate from, the handset 104. The booster amplifier 102 may also be implemented in a cradle configured to hold the handset 104. For example, the cradle may be mounted on a dash of a car and the handset 104 may be placed in the cradle. The communication between the cradle, which may include the booster amplifier 102, may be wired and/or wireless. In addition, signals to and from the handset 104 may be communicated with the amplifier 102 using a wired cable 118. More generally, the booster amplifier 102 may be included in a different form factor. When the booster amplifier 102 is used, for example, in a building or other area, the form factor may be adapted or configured for placement or mounting.

Similarly, the handset 104 may communicate content to the booster amplifier 102 by transmitting an RF signal from the antenna 116, which is ultimately received by the antenna 112. The booster amplifier 102 amplifies the received signal and retransmits the signal using the antenna 110. The transmitted signal is received by the base station 106, which may perform a number of operations on the signal, as determined by the wireless service provider.

Figure 2:
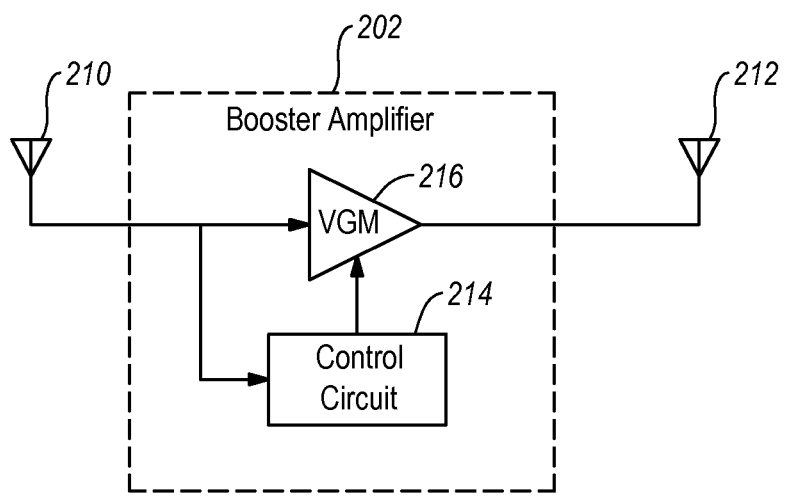
FIG. 2 illustrates a generalized amplifier with a control circuit that controls gain level.

FIG. 2 illustrates a generalized directional amplifier 202 (an example of the booster amplifier 102) configured for producing an optimal gain level, in accordance with the present invention. The booster amplifier 202 is unidirectional in this example in the sense that gain is only controlled in the uplink direction or in the downlink direction. The amplifier 202 is connected to an antenna 210, which is configured to receive a signal. The antenna 210 converts the received signal into an electrical signal. The electrical signal is received by a variable gain module (VGM) 216, which applies an amplification factor to the electrical signal. In one embodiment, the electrical signal is communicated via a second antenna 212, which transmits the adjusted electrical signal as an RF signal, to be received by one or more handsets or other devices.

The variable gain module 216 is controlled by a control circuit 214. The control circuit 214 receives the electrical signal from the antenna 210, and based on, by way of example, the properties of the electrical signal and/or other parameters, determines an optimal amplification factor that should be applied to the electrical signal. The control circuit 214 provides a control signal to the variable gain module 216. The control signal instructs the gain module 216 as to the amplification factor that should be applied to the electrical signal.

Many factors or parameters may be accounted for when calculating the required amplification factor. Factors include, by way of example and not limitation, the level or strength of the electrical signal and whether there is any indication that the booster amplifier 202 is oscillating or overloading the cellular network in any way or affecting other wireless networks.

The amplification factor, in one embodiment, can be a multiplier that is applied to the electrical signal. The amplification factor can result in either an amplified or attenuated output signal. In other words, where the absolute value of the amplification factor is less than one, the amplified adjusted signal will have lower amplitude than the original electrical signal. Conversely, when the absolute value of the amplification factor is greater than one, the amplified adjusted signal will have greater amplitude than the original electrical signal.

The control circuit 214 is an example of a processor that can be used for processing inputs. As described in more detail below, the control circuit 214 may also receive other inputs, which are examples of factors or parameters, that are used when setting the gain to be applied to the electrical signal. The inputs can be derived from the input signal or received from other sources.

Figure 3:
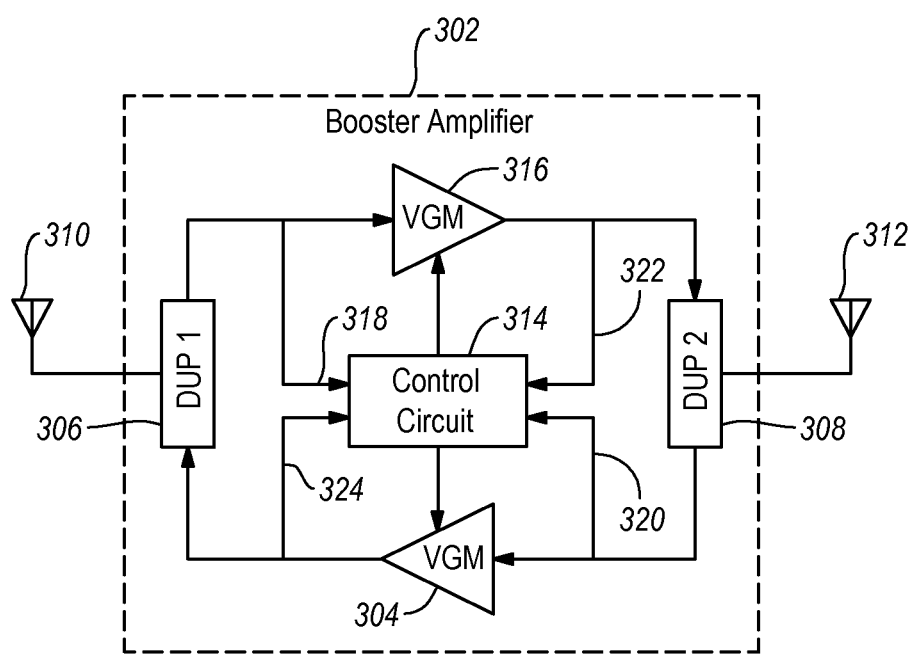
FIG. 3 illustrates an embodiment of a bidirectional amplifier configured to control the amplification of signals between at least two devices.

FIG. 3 illustrates one embodiment of a bidirectional amplifier 302 (an example of the booster amplifier 102) configured to control the amplification of cellular signals being transmitted between a base station and a handset (or other wireless signals transmitted between two devices or apparatus). Similar to the amplifier 202 illustrated in FIG. 2, a cellular signal is received from a base station at the antenna 310 and is passed to both a control circuit 314 and a variable gain module 316. Control circuit 314 controls the amplification factor of variable gain module 316. The amplified signal may be connected to a second antenna 312, which transmits a cellular signal to at least one handset.

Bidirectional cellular amplifier 302 is also configured to receive signals from one or more handsets, amplify those signals, and retransmit the signals to a base station. A signal from a handset may be received by antenna 312. The signal is routed to a second variable gain module 304, which applies an amplification factor to the signal. The amplification factor is determined and controlled by control circuitry 314.

In order to allow antennas 310 and 312 to simultaneously transmit and receive signals, duplexers (DUP) 306 and 308 are provided by way of example. A duplexer is defined as an automatic electrical routing device that permits simultaneous transmitting and receiving through a common point. More generally, a duplexer is a three port device with one common port "A" and two independent ports "B" and "C". Ideally, signals are passed from A to B and from C to A, but not between B and C. For example, the duplexer 306 receives an RF signal from a base station and converts the signal into a first electrical signal, which is routed to the inputs of the variable gain device 316 and the control circuitry 314. The duplexer 306 simultaneously receives a second electrical signal from the output of the variable gain module 304, and causes this signal to be transmitted as an RF signal via the antenna 310.

The control circuitry 314 may be configured to accomplish various objectives when determining the amplification factors to be applied to the variable gain modules 304 and 316. Exemplary objectives include, but are not limited to, i) setting the power level at which the signals are transmitted at a sufficient level to ensure that the signals reach a target destination; and ii) ensuring that the signals transmitted from the booster amplifier are transmitted at a power level that substantially eliminates the interference that would otherwise be introduced into the surrounding cellular network.

First, the control circuitry 314 establishes the amplification factors of the variable gain modules 304 and 316 so that the resultant signals are transmitted with sufficient power to adequately reach a target destination, such as a handset or a base station while not exceeding regulatory or other (e.g. industry) established power limitations. Where the cellular signal received at the antenna 310 has undergone significant attenuation, e.g., when the target destination is located a long distance away from the booster amplifier 302, the amplification factor is increased. Conversely, where the cellular signal received at the antenna 310 is at a sufficiently high level, a lower amplification may be established for variable gain modules 316 and 304. Thus, the amplification factor or gain for various conditions can be determined by considering these parameters.

Second, the control circuitry 314 ensures that the signals transmitted from the booster amplifier 302 are transmitted at a power level that substantially eliminates the interference that would otherwise be introduced into the surrounding cellular network. Many cellular networks, such as CDMA systems, are configured such that the power level transmitted by each handset in the network is determined by the base station. When communication between a handset and a base station is initiated, a "handshake" occurs between the handset and base station, and the base station instructs the handset as to the power at which the handset should transmit. If the base station determines that the signal from the handset is too strong, it will instruct the handset to reduce the power level of the transmitted signal. The CDMA system is designed so that all of the signals coming into the base station are of approximately the same power. If one signal arrives at the base station at a power level that is significantly higher than the others, it can potentially overpower the base station and cause interference with the other handsets in communication with the base station.

Therefore, the control circuitry 314 may determine the maximum amplitude or power level that can be transmitted by antenna 310 to substantially eliminate interference. Interference is considered to be substantially eliminated, in one example, when signals are transmitted from the booster amplifier 302 without causing harmful effects to the surrounding cellular network. For example, interference is substantially eliminated where the signals are transmitted without overpowering the base station, or otherwise interfering with other handsets within the cellular network in a way that degrades their performance. The control circuitry 314 may establish the amplification factors applied to variable gain modules to either attenuate or amplify the electrical signals in order to achieve this objective.

The determination of the amplification factor values may be dependent on whether the signals received from the base station via antenna 310 exceed a threshold (also referred to herein as a threshold level or threshold value). The threshold value may be a predetermined set value, or may be a variable that is not established until the control circuitry 314 makes a determination. For example, if after analyzing the strength of the signals received via antenna 310, the control circuitry 314 determines that the signal attenuation between cellular booster amplifier 302 and the target base station or handset is substantial, the control circuitry 314 may establish higher threshold values than if the base station signal was less attenuated. The higher threshold values would allow a greater amplification factor to be applied to the signals so that the transmitted signals will reach their target destination. Because of the substantial distance over which the signals must traverse, the signals will arrive at the target destination (e.g., a base station) without exceeding an appropriate power level, and will therefore not overpower the base station or cause substantial interference with signals transmitted from other handsets.

In the embodiment of FIG. 3, the amplification factors applied to the variable gain modules 316 and 304 may both be determined based on the attributes of the signal received from a base station via the antenna 310. The input signal from the base station is received by the control circuitry 314 from the antenna 310 at the connection 318, and radiated to a handset via antenna 312. The control circuitry 314 can make a number of determinations based on the attributes of the base station signal. First, the control circuitry 314 can determine the amplitude level of the signal from the base station. Based on the amplitude, the control circuitry can determine an adequate amplification factor for the variable gain module 316 to enable communication of the received signal to a handset. Second, the amplitude of the signal received from the base station is also an indicator of the amplitude required to successfully transmit a signal back to the base station via the antenna 310. For example, if the control circuitry 314 measures low amplitude of the first electrical signal, it is likely that the signal transmitted by the base station has been substantially attenuated between the base station and the booster amplifier 302. Therefore, it can determine the amplification factor required by the variable gain module 304 so that the second electrical signal originating from the handset is retransmitted with sufficient power to reach the base station (within allowable regulatory and/or other established power limitations).

The control circuit 314 may also receive additional input. The control circuit may receive an input signal from the connections 320, 322, and 324 which correspond, respectively, to the input signal from the handset, the output signal of the VGM 316, and the output signal of the VGM 304.

Figure 4:
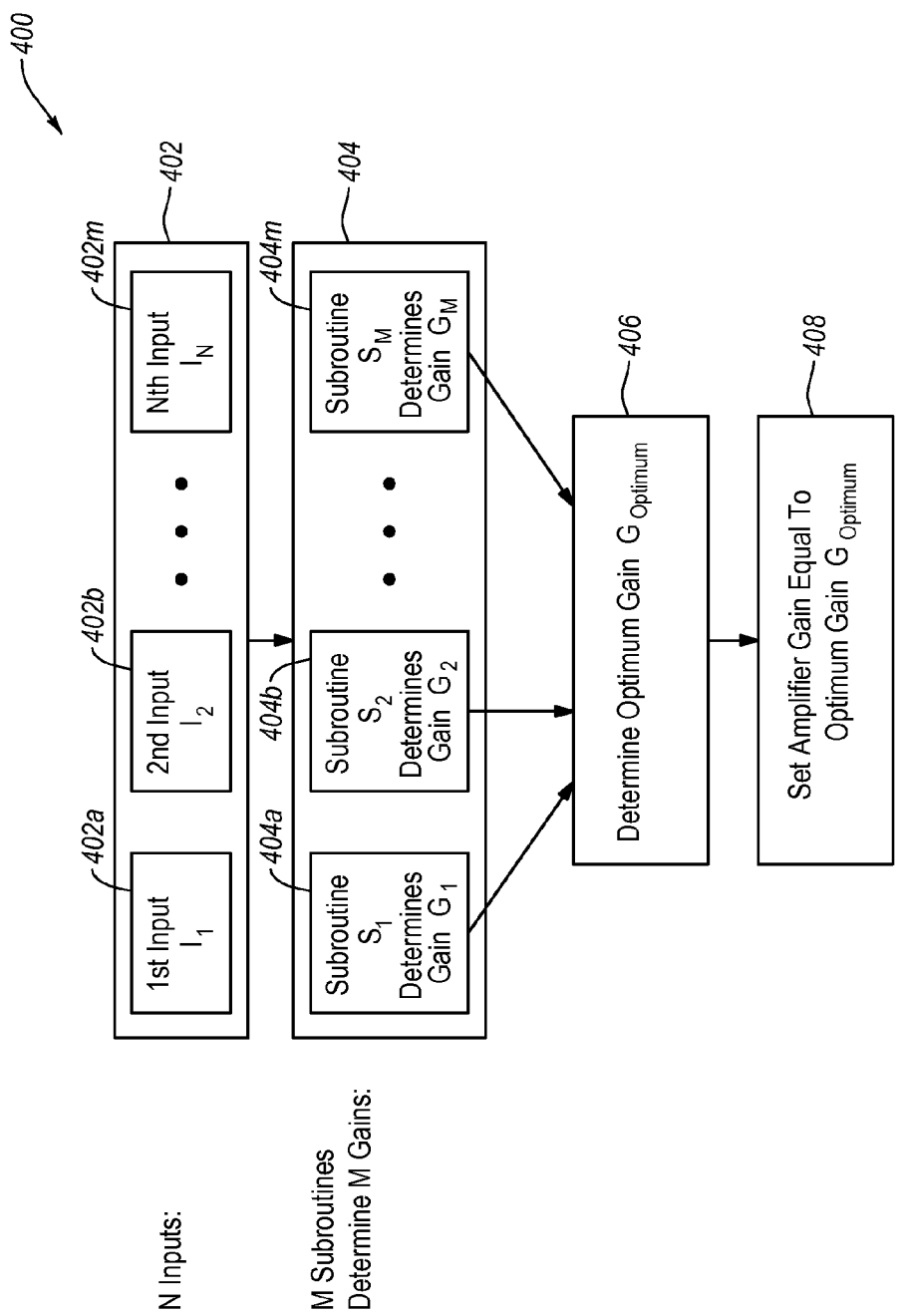
FIG. 4 illustrates an example of a method for determining an optimal gain for an amplifier.

The control circuit 314 can also implement additional gain control based on other parameters. FIG. 4 illustrates an example of a method for determining an optimal gain for an amplifier such as the amplifier 302. The inputs 402 can be received by the control circuit 314. The inputs 402 can be measured by the control circuit, stored in memory and accessed when needed, updated regularly by the amplifier, and the like.

The inputs 402 correspond to possible external parameters that may relate to issues that should be mitigated when setting the gain of the amplifier. Embodiments of the invention may only use some of the inputs and can be configured to accept additional inputs. Examples of the parameters that serve as the inputs 402 include, by way of example only:

Input to the amplifier received from a cell phone (or cell phones) or other device(s);
Output from the amplifier to a cell phone (or cell phones) or other device(s);
Input to the amplifier received from a cellular system base station (or base stations) and/or other wireless networks;
Output from the amplifier to a cellular system base station (or base stations) and/or other wireless network components;
Power/Current supplied to the booster amplifier from the power source (e.g. battery, power supply, etc.); and/or
Indication of a distance between cell phone(s) or other device(s) and the amplifier or its accessories (e.g. cradle for holding a cell phone, antennas, etc.).

As a result of any of the above inputs 402, and/or in consideration of relevant technical requirements, the method determines the control of the amplifier's circuitry such that optimum gain is obtained in both directions of amplification, i.e. from the base station(s) to the cell phone(s) or other device(s), and from the cell phone(s) or other device(s) to the base station(s).

FIG. 4 illustrates, in this example, a plurality of subroutines 404 that can be performed, for instance, by the control circuit 314 or other processor. The subroutines 404 determine potential gains based on the corresponding input(s). More specifically, the subroutines 404a, 404b, . . . 404m determine optimum gains for the respective inputs 402a, 402b, . . . 402n or a combination of the inputs. The subroutines 404 may include subroutines that accept one or more of the inputs 402. As a result, the number of inputs is not necessarily the same as the number of the subroutines 404. In some examples, a particular subroutine may be receive multiple inputs and be able to identify gains for multiple combinations of the inputs.

For example, the subroutine 404a may determine potential gain based upon the input 402a. Each of the subroutines 404 may be configured to mitigate a particular issue (e.g., power level, oscillation, distance from base station, distance from cell phone, power/current from power source, etc.). When determining a potential gain to mitigate an issue, each subroutine may use more than one of the inputs 402. In other words, the subroutines 404 are not limited to a particular input. For example, the optimum gain to mitigate the distance between the amplifier and the base station may use the power/current drawn by the amplifier as well as the input from the base station.

In another example, the subroutines 404 can determine a potential gain according to the power level of the signals received from the base station. When setting the gain in consideration of this issue, the amplifier may i) consider setting the power level at which the signals are transmitted at a sufficient level to ensure that the signals reach a target destination; and ii) ensure that the signals transmitted from the booster amplifier are transmitted at a power level that substantially eliminates interference.

After the subroutines 404 have identified potential gains to mitigate for various issues, the control circuit determines 406 the optimum gain $G_{Optimum}$ based on the potential gains ($G_{l-m}$) produced by the subroutines 404. The control circuit may then set 408 the amplifier gain equal to the optimum gain $G_{Optimum}$. The amplifier gain may be different for reverse link signals than for forward link signals.

The performance of the booster amplifier is thus compatible with the cellular system and provides maximum gain/performance to the subscriber using the amplifier. This is done, in one embodiment, by implementing two or more subroutines. Each subroutine establishes the optimum gain allowable in consideration of the issues that the subroutines mitigate. In some instances, the subroutines can mitigate different issues using the same input(s). Embodiments generate an optimum or a preferred gain by encompassing several (two or more) subroutines each of which ameliorates a specific problem. The amplifier determines the optimum gain allowable for the amplifier in consideration of the potential gains generated by at least some of the subroutines. The amplifier is configured with structure and architecture that is amenable to adding additional subroutines for which the need becomes apparent. As additional problems are identified, additional subroutines can be included and used in determining the optimal gain for the amplifier.

Figure 5:
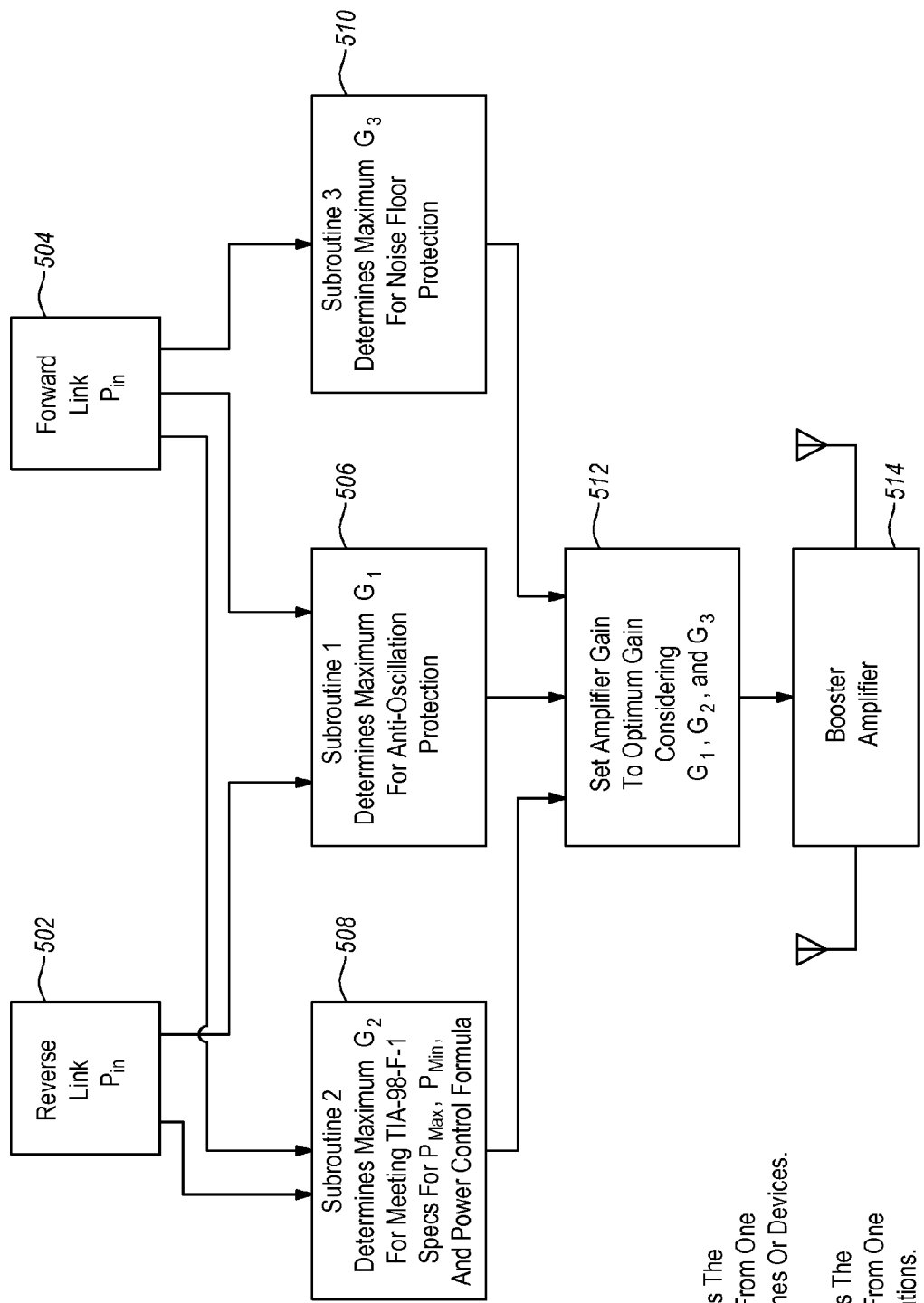
FIG. 5 illustrates an embodiment of a system and method for setting an optimum gain in an amplifier.

FIG. 5 illustrates an embodiment of a system and method for setting an optimum gain. Inputs 502 and 504 can be sensors/detectors that develop electrical output signals that are a function of Forward Link and Reverse Link power inputs to an amplifier, such as the amplifier 302. The Forward Link power input 504 is the power that is received from the base station and the Reverse Link power input 502 is the power received from the cell phone(s) and or other device(s). The amplifier may use a single input 502 for all cell phones or multiple inputs 502. These electrical signals generated by the inputs 502 and 504 are processed by a processor, such as the control circuit 314 or other micro-processor/controller, using three unique subroutines in this example.

The first subroutine 506 determines the optimum Gain $G_1$ in consideration of self-oscillation. The second subroutine 508 determines the optimum Gain $G_2$ considering the requirements of an industry standard, (e.g., TIA-98-F-1 and/or other standards). The third subroutine 510 determines the optimum Gain $G_3$ in consideration of the maximum allowable noise increase in a base station's receiver or in the base station. Such noise can potentially interfere with the proper performance of base stations, and can be reduced to an acceptable level by controlling the gain of the booster amplifier.

The first subroutine 506 can determine a maximum gain $G_1$ to account for oscillation in the amplifier or for oscillation protection. For example, the first subroutine 506 analyzes the inputs (e.g., the cellular signals) to detect the presence of an oscillation in the amplifier. Where an oscillation is detected, the control circuit adjusts the gain $G_1$ in a manner that stops the oscillating condition. The gain $G_1$ can be determined by measuring the apparent signal level of the cellular signal received from the handset and/or from the base station. If one or both of the signals exceed a predetermined signal value, an oscillatory condition likely exists, and the amplification factor of gain $G_1$ is then reduced by a predefined amount.

In another embodiment, the amplifier is simply shut off when an oscillation is detected. Alternatively, the value of the amplification factor may be incrementally reduced until the oscillation is eliminated. One embodiment of the invention combines both of the above aspects, and automatically shuts off the amplification when a severe oscillation is detected, but may alternatively incrementally reduce the amplification until a less severe oscillation is stopped.

The second subroutine 508 determines a maximum gain $G_2$. Cell phones may have a built-in power control algorithm that adjusts their power output based upon the power that they receive from base stations. This built-in power control algorithm is in accordance with the requirements of relevant industry standards. For example, for CDMA phones, the standard is "Recommended Minimum Performance Standards for cdma2000® Spread Spectrum Mobile Stations—Addendum, TIA-98-F-1", published by the Telecommunications Industry Association. The initial power transmitted by the cell phone to a base station (i.e. before being in closed loop wherein the base station controls the cell phone's transmitted power) is a function of the power received from the base station. This cell phone reverse link (output) power should be maintained within close tolerances in order to preclude interfering with the base station and/or jeopardizing the communicability of the cell phone. With some exceptions that will be described, this is expressed, mathematically, by the above mentioned standard as:

$$Pout = -Pin - K$$

Where:
Pout is the (reverse link) output power of the cell phone in dBm;
Pin is the (forward link) power that the cell phone receives from a base station in dBm; and
K is a constant depending upon the frequency band and other factors and is most commonly equal to 73 dB for the 824-894 MHz band and 76 dB for the 1850-1910 MHz band.

Exceptions in one embodiment:
Maximum power may never exceed 30 dBm even when the formula implies a greater value;
Whenever the base station commands a cell phone to transmit Minimum Power, the cell phone's power must be −50 dBm or less; and
Whenever the base station commands a cell phone to transmit Maximum Power, the cell phone's power must be at least 23 dBm, but not more than 30 dBm.

There may be two inputs to subroutine 508. The first is indicative of the reverse link power input received by the amplifier from a cell phone, and the second is indicative of the forward link power received by the amplifier from a base station in one example. At any instant, knowing the reverse link power from the cell phone and the forward link power from the base station enables the subroutine to determine the gain of the amplifier so that it is compliant with the above formula (e.g., Pout=−Pin−K) and exceptions identified above. The second subroutine 508 determines a maximum value for $G_2$ that is the largest value possible in accordance with the above formula and special cases (exceptions).

The third subroutine 510 determines a gain for noise floor protection. In general, an amplifier transmits thermal noise that is inherently present at its input. The noise power output from any amplifier can be calculated using, by way of example and not limitation, the formula:

$N_{out}$=FGkTB, where $N_{out}$=noise power output in watts, F="noise factor" of the amplifier (this is a measure of the noise internally generated by the amplifier), G=gain of the amplifier, k=Boltzmann's constant (1.38e-23 watts/Hz-K), T=temperature (degrees Kelvin), and B=bandwidth (Hz).

By knowing the Forward Link power received from the base station, and additional factors which will be described, the third subroutine is able to establish a maximum value for gain $G_3$ for the third subroutine 510.

The additional factors may include:
The equivalent radiated power of the base stations transmitter (i.e. transmitter power output increased by transmitting antenna gain and less losses such as those from cables, connectors, etc.);
The maximum allowable increase in noise that is permitted in the base station receiver, which is more commonly referred to as "allowable noise floor increase";
The gain of the base station's receiving antenna;
The gain of the amplifier's antenna;
The amplifier's gain; and
The amplifier's noise figure.

The parameters of the base station (e.g. equivalent radiated power, permitted increase in noise, gain of receiving antenna) may be set to be typical values that are generally known, or they may be set to be specifically required values when necessary, or some may be typical values and others can be set to specifically required values.

At any instant, based upon the received Forward Link power, the third subroutine 510 takes into account at least some of the above mentioned additional factors and determines the maximum gain $G_3$ such that the noise power transmitted by the amplifier will not cause the noise floor in the base station's receiver to increase by more than the allowable amount.

The gains $G_1$, $G_2$, and $G_3$ of the subroutines 506, 508, and 510, respectively, are resolved to determine the optimal gain 512 by considering all of the gains generated by the subroutines 506, 508, and 510 for the booster amplifier 514 (which is an example of the amplifier 302). The optimal gain can be resolved, for example, by averaging, by weighted averaging, and the like. The optimal gain may be set to one of the potential gains generated by the subroutines. Alternatively, the optimal gain may be set to lowest potential gain (lowest value of $G_1$, $G_2$, $G_3$). In some instances, the gain from one subroutine may be given preference or may act as a limit to the optimal gain. For example, if the subroutine 506 determines a gain that is associated with oscillation, the potential gain determined by the first subroutine 506 may limit the optimal gain. In addition, the optimal gain can be updated repeatedly or continually. As the inputs to the subroutines change, the optimal gain is likely to change as well. Thus, embodiments of the invention can dynamically adapt to changes in the inputs that may impact the optimal gain of the amplifier in either the reverse link and/or forward link direction.

The microprocessor or control circuitry, with suitable interface circuitry, then sends an electrical signal to the gain control (e.g., a variable attenuator or other VGM) of booster amplifier 514 that sets the booster amplifier's gain to be the optimal value that was determined as described herein.

Before an actual ("closed loop") connection is made between a base station and a wireless device (e.g., a cell phone), the cell phone is unconnected ("open loop") and attempts to make a connection by setting its initial output power based upon the received power from the base station that it intends to connect with. After making the connection with a base station, the base station controls the power transmitted by the cell phone, thereafter making continuous corrections to the cell phone's power output as may be necessary. However, if the unconnected ("open loop") transmitted power from a cell phone is not within established tolerances, it may not be possible for the cell phone to connect with the base station. Cell phones have a built-in power control algorithm that adjusts their initial output power according to the power that they receive from base stations. The cell phone's built-in power control algorithm is in accordance with the requirements of relevant industry standards.

Embodiments of the invention ensure that the booster amplifier will not increase the Noise Floor of nearby off-channel Base Stations beyond an acceptable amount.

The power transmitted by the booster amplifier, such as the booster amplifier 102 (with the attached cell phone, PDA, etc.), meets the requirements of the cellular system, as defined herein or as defined by the cellular system operator, industry standards, or government regulations. This ensures that base stations will not be overloaded by an excessively strong signal and also ensures optimum gain of the base station's forward link signal (received by the cell phone) thereby giving maximum benefit to subscribers without harming the cellular system.

Figure 6A:
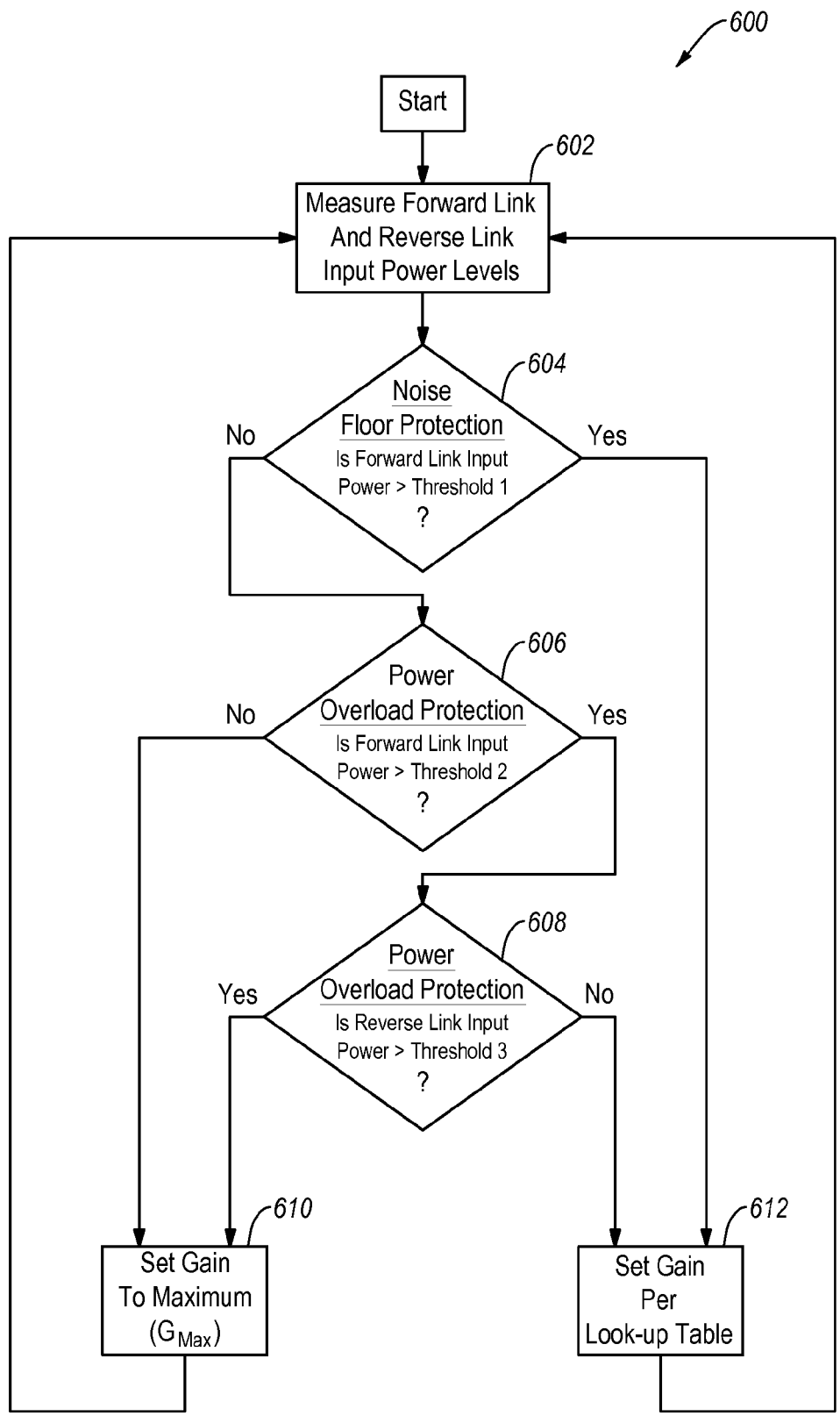
FIG. 6A illustrates an example of a flow diagram for setting the gain of an amplifier operating in a network environment.
Figure 6B:
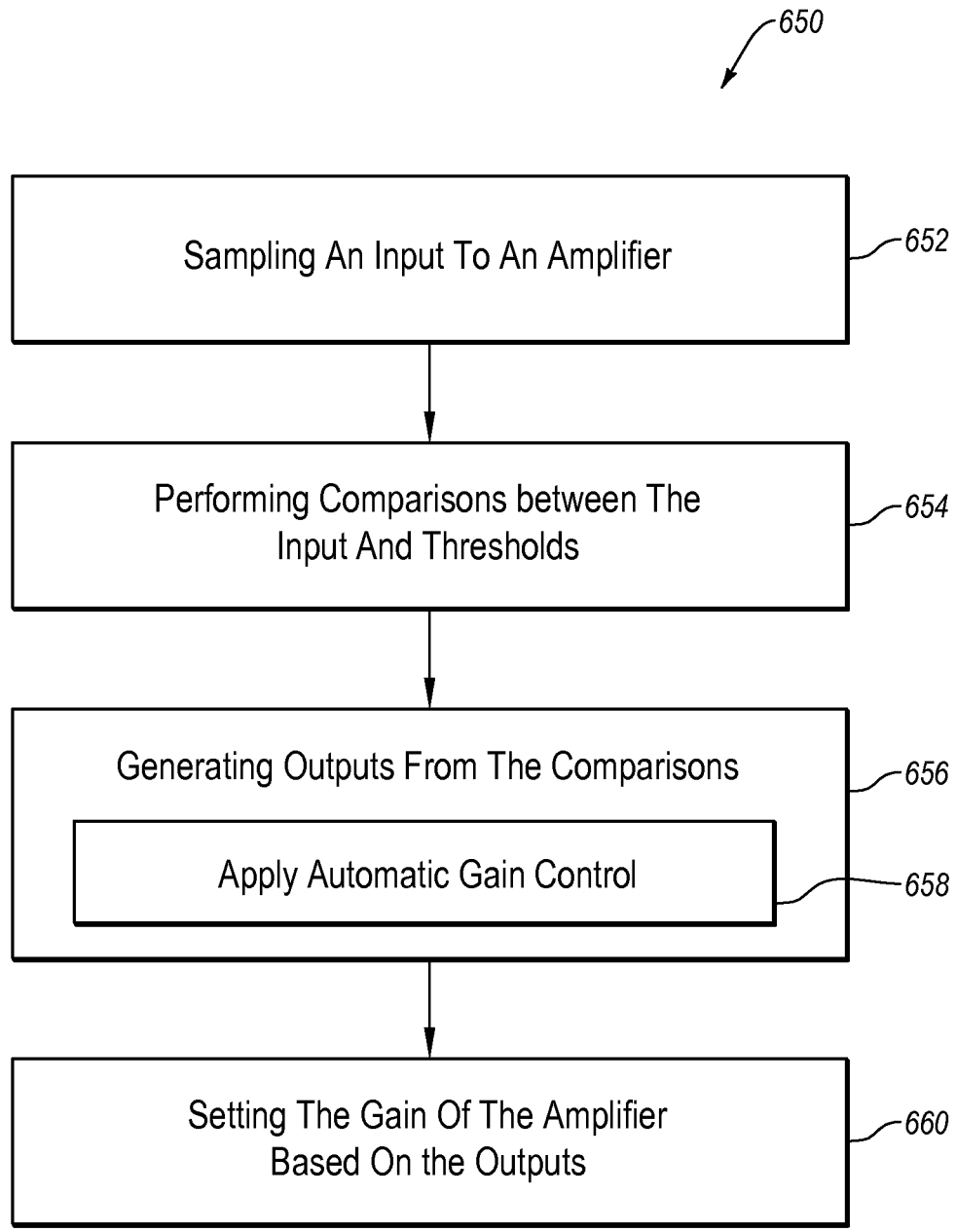
FIG. 6B illustrates another example of a flow diagram for setting the gain of an amplifier.
Figure 7:
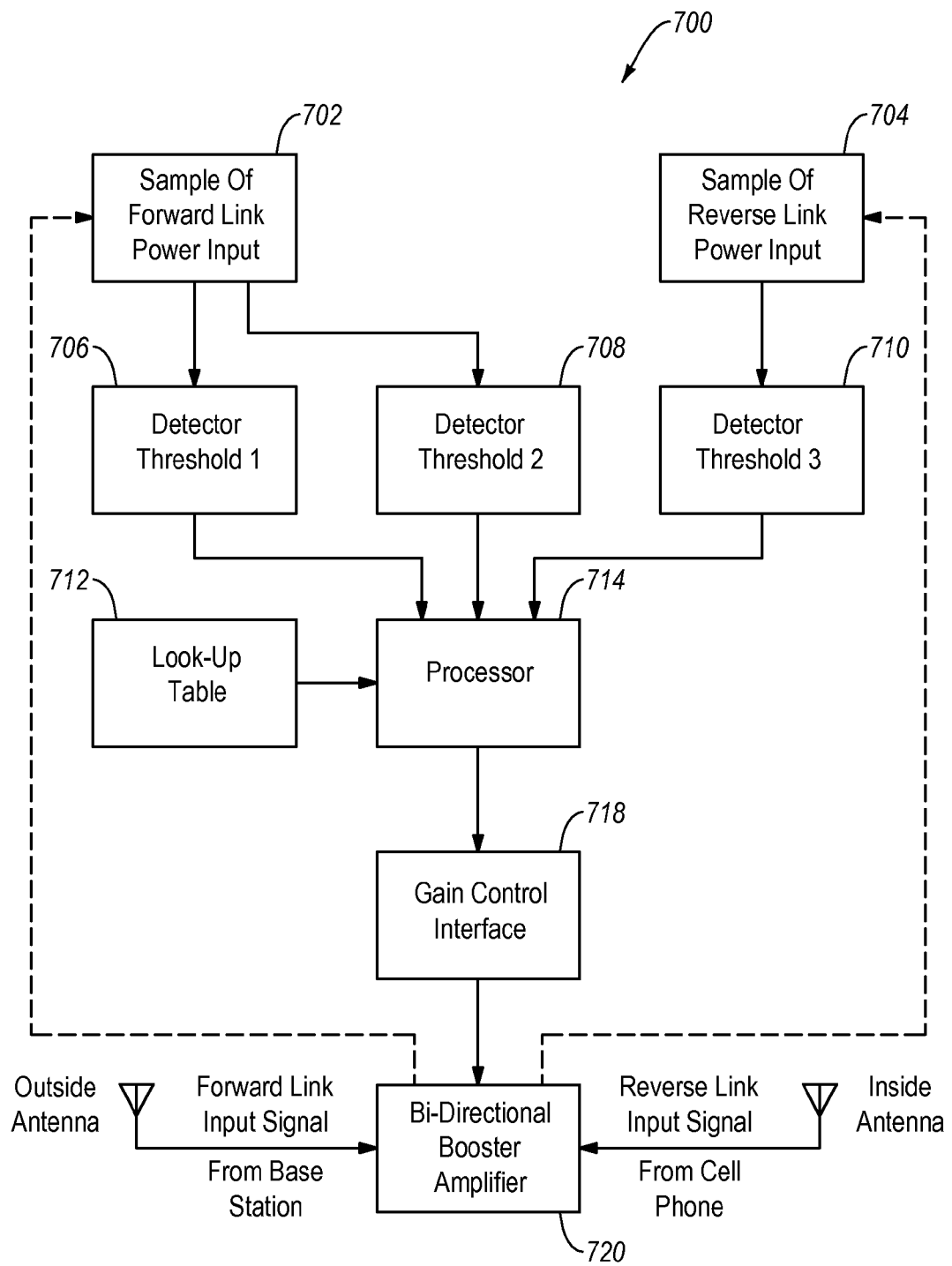
FIG. 7 illustrates an embodiment of a system and method for implementing the flow diagrams illustrated in FIGS. 6A and/or 6B.

FIG. 6A illustrates a flow diagram for setting the gain of a booster amplifier or other device operating in a network environment. FIG. 6B illustrates another example of a flow diagram for setting the gain of a booster amplifier or other device. FIG. 7 shows an illustrative embodiment of an amplifier that implements the logic shown in FIGS. 6A and 6B. In addition, FIGS. 6A, 6B and 7 illustrate an example of the subroutines (e.g., the subroutines 506, 508, and/or 510) illustrated in FIG. 5.

The method 600 often begins by sensing 602 inputs. The inputs include, by way of example and not limitation: (i) power input to the booster received from a cell phone (or cell phones) or other device(s) (those knowledgeable in the art commonly refer to this as "reverse link" input) and (ii) power input to the booster received from a base station (or base stations) (those knowledgeable in the art commonly refer to this as "forward link" input).

Knowing the reverse link power from the cell phone and the forward link power from base stations enables determination of the gain of the booster amplifier that gives maximum benefit to the subscriber while maintaining compliance with the requirements of cellular systems as explained herein.

Embodiments also substantially mitigate interference to nearby base stations, which are not in communications with the subscriber. This is often referred to in the technical literature as the "Near/Far" problem. It occurs when a device is communicating through a distant ("far") base station while, at the same time, the device is physically located very close to a "near" base station that the device is not communicating through. As a result, the power output of the subscriber's cell phone (or other device) will be maximum in order to enable communicating with the far base station. But, such maximum power will be excessive to the near base station thereby causing interference, which could be extremely harmful to the near base station's operation.

Thus, the method 600 often begins by measuring or determining 602 the forward link and reverse link power levels. At block 604, the forward link input power is compared to a noise floor threshold level (threshold 1). The threshold level is the input that corresponds to a distance where noise floor interference is possible. If the forward link input power exceeds the noise floor threshold level, then the gain of the amplifier is set 612 to be the gain in a lookup table stored in the booster amplifier. When the input power does not exceed the noise floor threshold level, the forward link input power is compared 606 to a power overload threshold level to determine if there is a potential problem of power overload to nearby base stations. At block 606, a measurement is made that determines whether or not the forward link input power is greater than the power overload threshold level (threshold 2). When the forward link input power is less than the power overload threshold level, the gain of the booster amplifier may be set in box 610 to be the Maximum Gain (Gmax). When the forward link input power is greater than the power overload threshold level, then the reverse link input power is examined and compared in box 608 to a second power overload threshold level (threshold 3). If the second power overload threshold level is exceeded, then the amplifier's gain is set in box 610 to be the Maximum Gain (Gmax). If, however, the second power overload threshold level is not exceeded, then the amplifier's gain is set in box 612 to a value determined by the lookup table. After setting the gain of the amplifier to be either Gmax or to a value from the Lookup Table, the method returns to the initial measurement in block 602, and thereafter proceeds as previously described. This repetitive process continues as long as the booster amplifier is turned on.

In this way, the booster amplifier can dynamically determine the maximum gain for noise floor protection and/or for power overload protection.

One of skill in the art can appreciate that FIG. 6A illustrates examples and comparisons, which are performed in blocks 604, 606, and 608, to set the gain of the amplifier. The tests or comparisons in blocks 604, 606, and 608, however can be performed in a different order and/or with different dependencies. These tests or comparisons can also be performed independently. The gain of the amplifier can be set on the basis of a single comparison or on the basis of multiple comparisons. In addition, the comparisons used to set a particular gain can vary over time.

For example, the gain of the booster amplifier could be set based on a single comparison, any pair of comparisons, or any group of comparisons. In another example, the result of the comparison performed in block 606 may be used to trigger the comparison in block 604 and/or block 608.

FIG. 6B illustrates another example of a method 650 for setting the gain of an amplifier such as a booster amplifier or other device. In one example, the method 650 (similar to other apparatus and methods disclosed herein) may operate to address problems such as amplifier oscillation, overload issues, and noise floor problems. Often, the gain set or determined in the method 650 (and other methods disclosed herein) is a maximum gain in the sense that it should not be exceeded based on current conditions. As discussed herein, this gain may be reduced or altered based on other conditions such as maintaining the linearity of the amplifier.

The method 650 begins in box 652 by sampling an input to an amplifier such as the amplifier 302. The input may include the forward link input power, the reverse link input power, or other inputs or signals as discussed herein.

In box 654, comparisons are performed between the input and thresholds. For example, the forward link input power may be compared to one or more threshold values or levels. Similarly, the reverse link input power may be compared to one or more threshold values or levels.

The thresholds may include thresholds that are related to various issues that the amplifier may encounter. One of the thresholds may relate to a noise floor. Another threshold may relate to power overload protection. In some instances, the threshold for noise floor or power overload protection may be different for different inputs. As described herein, the comparisons can be performed in any order.

In box 656, outputs are generated from the comparisons performed in box 654 (examples of the comparisons are discussed herein and shown by way of example only in FIG. 6A). The gain of the amplifier is set based on the outputs in box 660. When setting the gain, by way of example, the amplifier may use one or more of the outputs. The outputs can be selectively evaluated such that the gain to which the amplifier is set may be based on any combination of the outputs. Each of the various outputs, for example, may be ranked or prioritized in some examples. The rank or prioritization of the outputs may change, however, based on conditions experienced by the cell phone, amplifier, base station, or the like. In addition, the gain can be dynamically adjusted over time as the outputs of the comparisons change.

In addition, the amplifier may also apply automatic gain control in box 658. Automatic gain control may be applied to the amplifier, for example, to maintain linearity of the amplifier. As a result, the gain determined by the outputs of the comparisons may be further altered by applying automatic gain control. For example, if the outputs of the comparisons suggest that the amplifier should be set at maximum gain, automatic gain control may reduce the gain, for example, to maintain linearity. Automatic gain control can be applied in both the forward link and reverse link directions and the gain may be different in the forward link and the reverse link directions.

When the lookup table is used to set the gain, the lookup table may be accessed, by way of example only, based on whether the various input signal levels are greater than or less than the various thresholds, based on one or more of the inputs to the amplifier, based on what type of issues is being mitigated, or the like or any combination thereof. For example, when the lookup table is used to set the gain, the lookup table may be accessed according to the forward link input power, the reverse link input power, or the like.

In another example, multiple lookup tables may be present. In this case, the lookup tables may be accessed based on one or more of the inputs (e.g., the forward or reverse link input power) and the type of issue being mitigated. As a result, the gain of the amplifier can be optimized using the lookup tables.

FIG. 7 illustrates an example of a booster amplifier. In FIG. 7, a sample relative to the power level of the forward link signal from the Base Station is detected to determine whether the signal is above or below either Threshold 1 or Threshold 2. The sample 702 is provided to a detector 706 and a detector 708. The detector 706 can determine whether the sample 702 exceeds the threshold 1 and the detector 708 can determine whether the sample 702 exceeds the threshold 2. Similarly, a sample 704 relative to the power level of the reverse link signal from the subscriber's cell phone, PDA, etc. is detected to determine whether the signal is above or below Threshold 3 using a detector 710. The samples may be provided as a voltage and the comparisons of the samples 702 and 704 to the relevant thresholds can be achieved using a voltage comparison circuit (which may be included in the processor 714). The samples can be converted to digital values before comparison to the relevant threshold values.

The outputs from the three threshold detectors 706, 708, and 710 are provided to the processor 714. The processor 714 may be a microprocessor, or a simple transistor or other logic circuit. The processor is also connected to a lookup table 712 that could be an integral part of the processor 714 or may be located in memory that is external to the processor. The processor 714 examines the outputs of the detectors 706, 708, and 710 and also examines the Lookup Table 712 (as needed) in order to determine the required gain of the bi-directional booster amplifier 720 as described with reference to FIGS. 6A and 6B. After the required or optimal gain is determined, the processor 714 originates a signal that feeds the gain control interface 718. The gain control interface 718 gives the correct drive (or signal) to the device(s) that actually adjust(s) the gain of the bi-directional booster amplifier 720. As previously stated, the gain control interface 718 may also apply automatic gain control to the amplifier, which may change or reduce the optimal gain, for various reasons, such as to maintain linearity of the amplifier 700.

There are several types of devices that could enable adjustable gain. Some examples are: pin-diode attenuators and active gain devices whose gain depends upon a DC control voltage, etc. The gain of the amplifier 720 may or may not be equal in forward link and reverse link directions depending upon the characteristics of the signals being amplified by the amplifier 720. The threshold detectors 706, 708, and 710, the processor 714, lookup table 712, and gain control interface 718 could be included in one hardware device (e.g. a PIC).

The lookup table(s) may include values that are determined according to characteristics of the amplifier, base stations, and cell phone(s). For instance, the maximum gain of the booster amplifier and the noise figure of the booster amplifier may influence the values in the lookup table. The allowable increase in the base station noise floor, and equivalent isotropic radiated power of the base station, the forward link power received at the antenna input of the booster amplifier, the maximum cell phone radiated power, the gain of the base station receive antenna, the path loss between the booster amplifier and the base station, and the path loss between the booster amplifier and cell phone(s), are additional examples of values that may influence the parameters set in the lookup table.

The following paragraphs assume the following values:
Maximum Gain of booster amplifier=38 dB
Noise figure of booster amplifier=6 dB
Allowable increase in base station noise floor=0.06 dB
EIRP (Equivalent Isotropic Radiated Power) of base station=48.7 dBm
Forward Link Power received at booster's outside antenna input=−28.9 dBm Maximum Cell Phone Radiated Power=23 dBm
Gain of base station receive antenna=15 dBi
Path Loss between booster and base station=77.6 dB
Path Loss between booster and cell phone=17 dB In this example, the above parameter values may be for a specific booster and typical base station characteristics. One of skill in the art can appreciate the determination of other values based on the booster and/or base station characteristics and/or path losses. In addition, changes to these values may require changing the lookup tables used to set the gain in the booster amplifier.

As previously stated, some of the values may be determined according to the characteristics of the amplifier. For example, to protect the base station noise floor when the forward link input power is equal to −27 dBm, the maximum allowable reverse link gain plus noise figure of the amplifier is 35 dB. The amplifier should lower its gain to this level even if this results in shutting the amplifier off This is an example of the gain of the booster amplifier for the first threshold, for example, at 604 in FIG. 6A.

For the second threshold and to protect against base station overload, for example at 606 in FIG. 6A, when the forward link input power is −38 dBm the maximum allowable reverse link gain plus noise figure of the amplifier is 31 dB.

For the third threshold and to protect from base station overload, for example at 608 in FIG. 6A, when the reverse link input power is +8 dBm the maximum allowable reverse link gain of the amplifier plus noise figure is 22 dB. The level of the reverse and forward link input powers allows the amplifier to determine whether the cell phone is communicating with a near or far base station in order to optimize gain.

In one example, a gain in an amplifier is set by initially measuring a forward link input power and/or a reverse link input power. The forward link input power is compared to a noise floor threshold level. A gain of the amplifier is set to a value in a lookup table when the forward link input power exceeds the noise floor threshold level.

If necessary, the forward link input power is compared to a first power overload protection threshold level when the forward link input power does not exceed the noise floor threshold level and the gain is set to a maximum gain when the forward link input power does not exceed the first power overload protection threshold level.

If necessary, the reverse link input power is compared to a second power overload protection threshold level when the forward link input power exceeds the first power overload protection threshold level. The gain is set to the maximum gain when the reverse link input power exceeds the second power overload protection threshold level. Alternatively, the gain is set according to a value in the lookup table when the reverse link input power does not exceed the second power overload protection threshold level.

The embodiments of the present invention may comprise a special purpose or general-purpose computing device including various computer hardware. The control circuit or other processor included in embodiments of the amplifier are examples of a computing device.

Embodiments within the scope of the present invention also include computer-readable media for carrying or having computer-executable instructions or data structures stored thereon. Such computer-readable media can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. Combinations of the above should also be included within the scope of computer-readable media. Computer-executable instructions comprise, for example, instructions and data which cause a general purpose computer, special purpose computer, or special purpose processing device to perform a certain function or group of functions.

The following discussion is intended to provide a brief, general description of a suitable computing environment in which the invention may be implemented. Although not required, the invention will be described in the general context of computer-executable instructions, such as program modules, being executed by computers in network environments. Generally, program modules include routines, programs, objects, components, data structures, etc. that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Those skilled in the art will appreciate that the invention may be practiced in network computing environments with many types of computer system configurations, including personal computers, hand-held devices, multi-processor systems, microprocessor-based or programmable consumer electronics, network PCs, minicomputers, mainframe computers, and the like. The invention may also be practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for setting a gain of an amplifier in a booster amplifier operating in a network, the method comprising:
   measuring signal power in the booster amplifier, wherein the signal power includes a forward link power and a reverse link power, the forward link power being determined based on a first signal from a base station and the reverse link power being determined based on a second signal from a wireless device;
   comparing the forward link power to a first threshold level;
   comparing the reverse link power to a second threshold level;
   determining a particular gain,
      the particular gain being a first gain when the comparison of the forward link power to the first threshold level is a first result and the comparison of the reverse link power to the second threshold level is a second result, and the particular gain being a second gain when the comparison of the forward link power to the first threshold level is a third result; and setting the gain of the amplifier to the particular gain.

2. The method of claim 1, wherein
the first threshold level comprises a first base station overload threshold level configured to prevent base station power overload, and
the second threshold level comprises a second base station overload threshold level configured to prevent base station power overload.

3. The method of claim 1,
wherein the first and/or second gain is determined based on at least one of:
a radiated power of the base station;
a maximum allowable increase in noise permitted in a receiver of the base station;
a gain of a receiving antenna of the base station;
a signal power received from the wireless device;
a gain of an antenna of the booster amplifier; and
a noise power transmitted by the booster amplifier.

4. The method of claim 1, wherein the first and/or second gain is based on characteristics of the base station, the wireless device, and/or the booster amplifier, wherein the signal power in the booster amplifier is determined in part by the base station and/or the wireless device.

5. The method of claim 1, wherein gain control performed in connection with the method is unidirectional only.

6. The method of claim 1, wherein gain control performed in connection with the method is bidirectional.

7. The method of claim 1, further comprising, after the gain of the amplifier has been set, generating an attenuated output signal.

8. The method of claim 1, further comprising, after the gain of the amplifier has been set, generating an amplified output signal.

9. The method of claim 1, wherein the first and second threshold levels have a set value.

10. The method of claim 1, wherein the first and second threshold levels have a variable value, wherein the value for the first and second threshold levels are determined based on a signal attenuation between the base station and the booster amplifier and/or the booster amplifier and the wireless device.

11. The method of claim 1, wherein the first result is the forward link power being greater than the first threshold level and the second result is the reverse link power being greater than second threshold level.

12. The method of claim 11, wherein the third result is the forward link power being less than the first threshold level.

13. The method of claim 1, wherein the particular gain is the first gain when the comparison of the forward link power to a third threshold level is a fourth result.

14. The method of claim 1, further comprising comparing the forward link power to a third threshold level, wherein the particular gain is the first gain when the comparison of the forward link power to the first threshold level is the first result, the comparison of the reverse link power to the second threshold level is the second result, and the comparison to the forward link power to the third threshold level is a fourth result.

15. The method of claim 1, further comprising applying automatic gain control to the gain of the amplifier after setting the gain of the amplifier to the particular gain, wherein the automatic gain control reduces the gain of the amplifier.

16. A method for setting a gain of an amplifier in a booster amplifier operating in a network, the method comprising:

measuring signal power in the booster amplifier, wherein the signal power includes a forward link power and a reverse link power, the forward link power being determined based on a first signal from a base station and the reverse link power being determined based on a second signal from a wireless device;
performing a plurality of subroutines, wherein a first of the subroutines determines a first output based on a comparison of the forward link power to a first threshold level and a second of the subroutines determines a second output in based on a comparison of the reverse link power to a second threshold level;
determining a particular gain based on the first output and the second output; and
setting the gain of the amplifier to the particular gain after determining the particular gain that accounts for each of the recommended gains.

17. The method of claim 16, wherein the first of the subroutines is performed for noise floor protection and the second of the subroutines is performed for base station overload protection.

18. The method of claim 17, wherein the first of the subroutines is performed for noise floor protection and the second of the subroutines is performed for base station overload protection.

19. A method for setting a gain of an amplifier operating in a network, the method comprising:
measuring one of an input signal power to the amplifier or an output signal power from the amplifier;
determining a first gain for reducing occurrences of self-oscillation of the amplifier based on one of the input signal power or the output signal power;
determining a second gain based on a maximum output signal power from the amplifier based on an industry and/or government standard;
determining a third gain for limiting an increase in a base station's noise floor; and
setting the gain of the amplifier based on the first gain, the second gain, and the third gain.

20. The method of claim 19, further comprising applying automatic gain control to the gain of the amplifier, wherein the automatic gain control reduces the gain.

21. The method of claim 20, wherein the automatic gain control ensures linearity of the amplifier.

22. A method for setting a gain of an amplifier in a booster amplifier operating in a network, the method comprising:
measuring signal power in the booster amplifier, wherein the signal power includes a forward link power and a reverse link power;
comparing the forward link power to a noise floor threshold level determined based on conditions of the network;
when the forward link power is greater than the noise floor threshold level, comparing the forward link input power to a first base station overload threshold level based on the conditions of the network;
when the forward link power is less than the first base station overload threshold level, determining a particular gain of the amplifier to be a maximum gain of the amplifier;
when the forward link power is greater than the first base station overload threshold level, comparing the reverse link power to a second base station overload threshold level;
based on the comparison of the reverse link power to the second threshold level, determining the particular gain of the amplifier to be the maximum gain of the amplifier or a gain less than the maximum gain of the amplifier that is determined based on the conditions of the network; and setting the gain of the amplifier based on the particular gain.

23. The method of claim 22, wherein the conditions of the network include one or more of:
- a radiated power of a base station;
- a maximum allowable increase in noise permitted in a receiver of the base station;
- a gain of a receiving antenna of the base station;
- a signal power received from a wireless device;
- a gain of an antenna of the booster amplifier; and
- a noise power transmitted by the booster amplifier.

* * * * *